(12) United States Patent
Hashimoto

(10) Patent No.: US 12,112,871 B2
(45) Date of Patent: Oct. 8, 2024

(54) POWDER MIXTURE OF MAGNETOPLUMBITE-TYPE HEXAGONAL FERRITE, METHOD FOR PRODUCING THE SAME, AND RADIO WAVE ABSORBER

(71) Applicant: FUJIFILM Corporation, Tokyo (JP)

(72) Inventor: Hirokazu Hashimoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 475 days.

(21) Appl. No.: 17/176,296

(22) Filed: Feb. 16, 2021

(65) Prior Publication Data

US 2021/0166851 A1    Jun. 3, 2021

Related U.S. Application Data

(63) Continuation of application No. PCT/JP2019/022008, filed on Jun. 3, 2019.

(30) Foreign Application Priority Data

Aug. 28, 2018  (JP) .................................. 2018-159193
May 27, 2019   (JP) .................................. 2019-098736

(51) Int. Cl.
| | | |
|---|---|---|
| H01F 1/34 | (2006.01) | |
| C01G 49/00 | (2006.01) | |
| C30B 29/22 | (2006.01) | |
| H01F 1/36 | (2006.01) | |
| H05K 9/00 | (2006.01) | |

(52) U.S. Cl.
CPC .......... H01F 1/348 (2013.01); C01G 49/0045 (2013.01); C30B 29/22 (2013.01); H05K 9/0081 (2013.01); *C01P 2002/50* (2013.01); *C01P 2002/76* (2013.01); *C01P 2006/42* (2013.01)

(58) Field of Classification Search
CPC ... H01F 1/348; H01F 1/36; H01F 1/37; H01F 1/34; H01F 41/00; C01G 49/0045; C01G 49/00; C30B 29/22; H05K 9/0081; C01P 2002/50; C01P 2006/42
See application file for complete search history.

(56) References Cited

FOREIGN PATENT DOCUMENTS

| | | |
|---|---|---|
| JP | 57-180206 A | 11/1982 |
| JP | 5-206676 A | 8/1993 |
| JP | 11-354972 A | 12/1999 |
| JP | 2007-250823 A | 9/2007 |
| JP | 2007-287846 A | 11/2007 |
| JP | 2008-169378 A | 7/2008 |
| JP | 2010-077198 A | 4/2010 |
| JP | 2010-114407 A | 5/2010 |
| JP | 4674380 B2 | 4/2011 |

OTHER PUBLICATIONS

Machine translation of JPH11354972A, 9 pages (Year: 1999).*
International Search Report issued Jul. 23, 2019 in International Application No. PCT/JP2019/022008.
Written Opinion of the International Searching Authority issued Jul. 23, 2019 in International Application No. PCT/JP2019/022008.
International Preliminary Report on Patentability issued Mar. 2, 2021 in International Application No. PCT/JP2019/022008.
Notification of Reason for Refusal dated Jan. 17, 2022 from the Korean Intellectual Property Office in KR Application No. 10-2021-7004543.
Communication dated Sep. 7, 2021 from the Japanese Patent Office in Application No. 2020-540071.
Extended European Search Report dated Oct. 1, 2021 in Application No. 19854603.8.
Decision of Refusal dated Apr. 5, 2022 from the Japanese Patent Office in Japanese Application No. 2020-540071.

* cited by examiner

*Primary Examiner* — Matthew E. Hoban
*Assistant Examiner* — Lynne Edmondson
(74) *Attorney, Agent, or Firm* — Sughrue Mion, PLLC

(57) ABSTRACT

A powder mixture of a magnetoplumbite-type hexagonal ferrite is a mixture of powders of two or more kinds of compounds represented by Formula (1), the two or more kinds of compounds represented by Formula (1) are two or more kinds of compounds having different values of x in Formula (1), and are a powder mixture satisfying a relationship of $x_{max} - x_{min} \leq 0.2$, in a case where a maximum value of x is defined as $x_{max}$ and a minimum value of x is defined as $x_{min}$, in two or more kinds of compounds having different values of x in Formula (1), and the application. In Formula (1), A represents at least one metal element selected from the group consisting of Sr, Ba, Ca, and Pb, and x satisfies $1.5 \leq x \leq 8.0$.

$$AFe_{(12-x)}Al_xO_{19} \quad \text{Formula (1)}$$

8 Claims, 7 Drawing Sheets

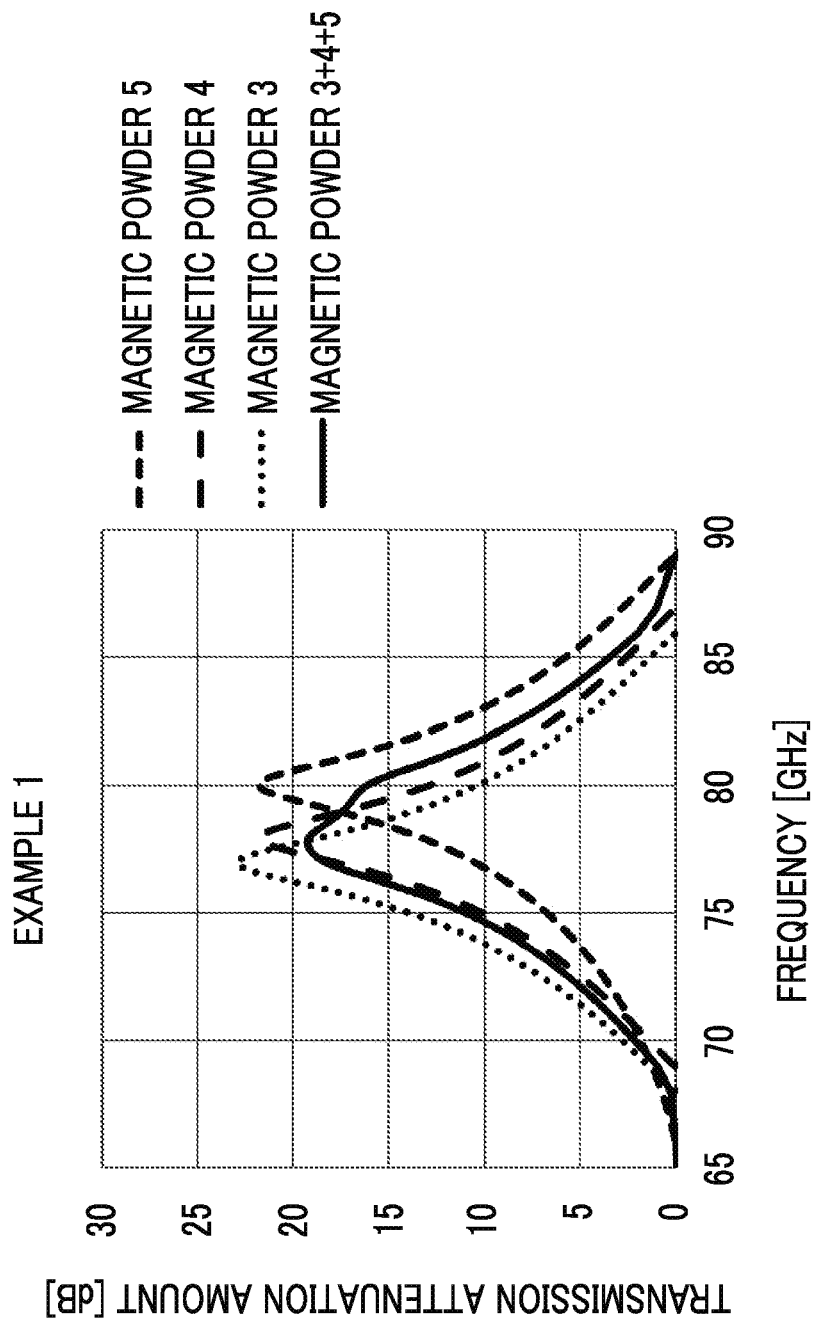

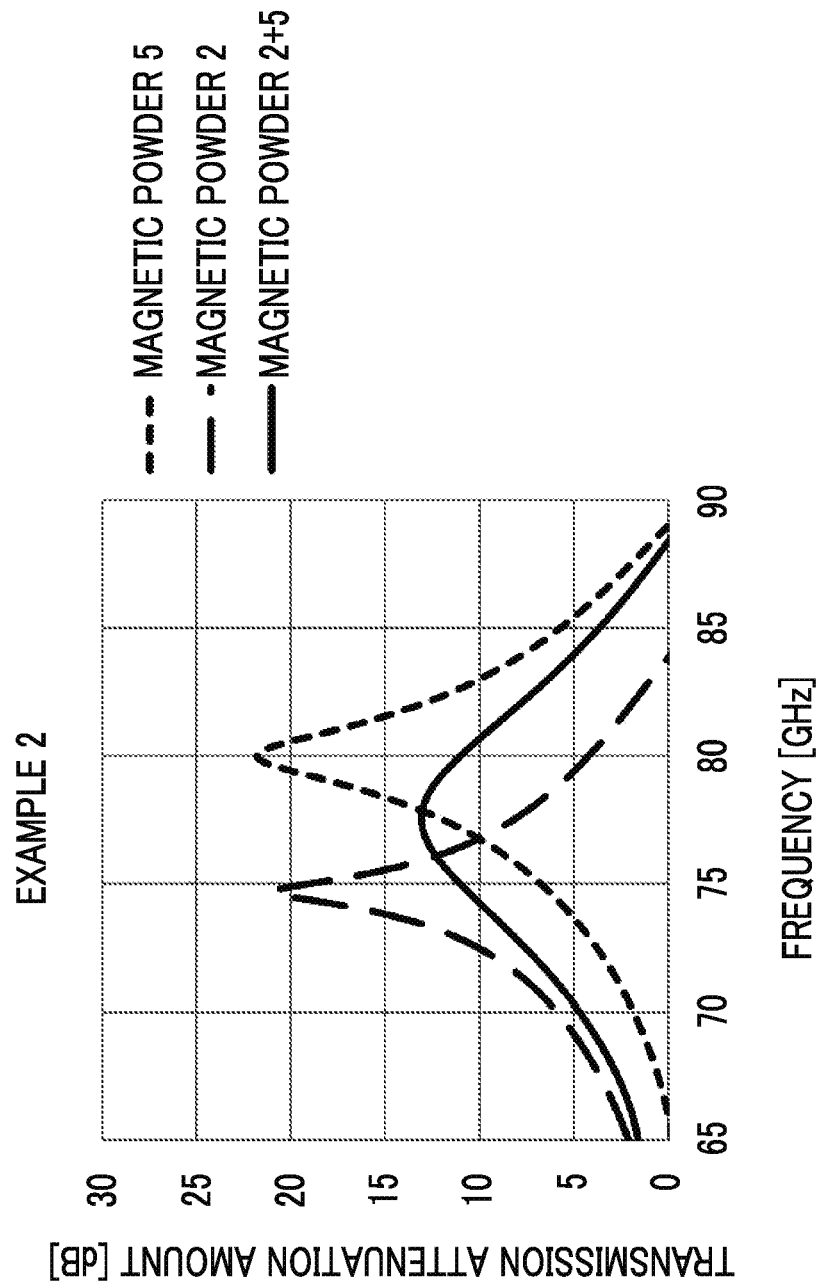

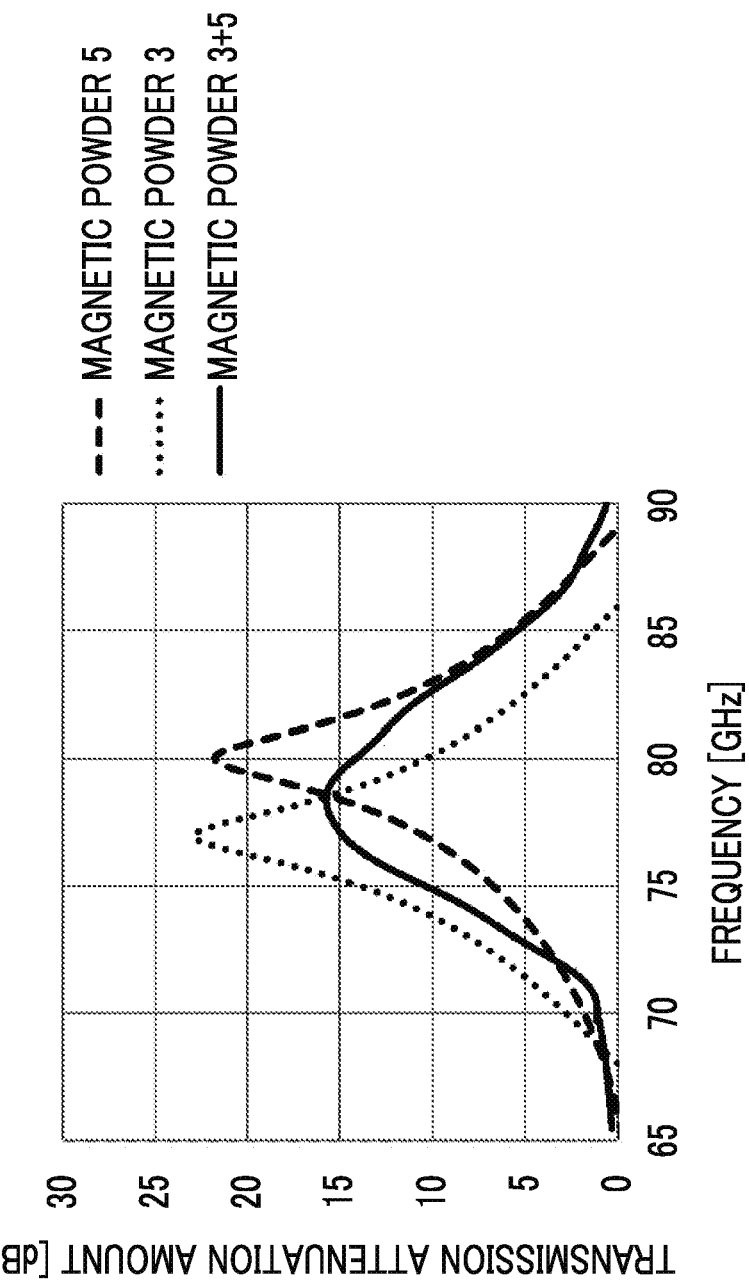

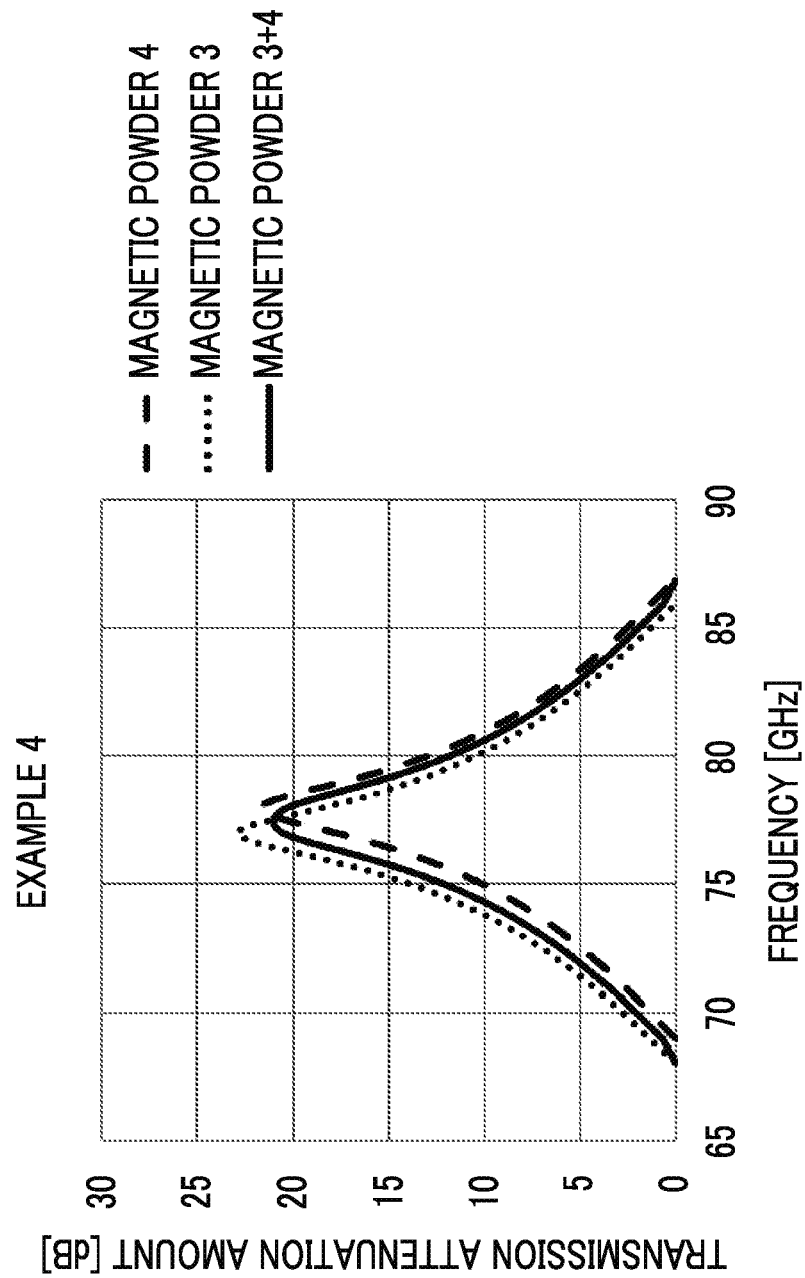

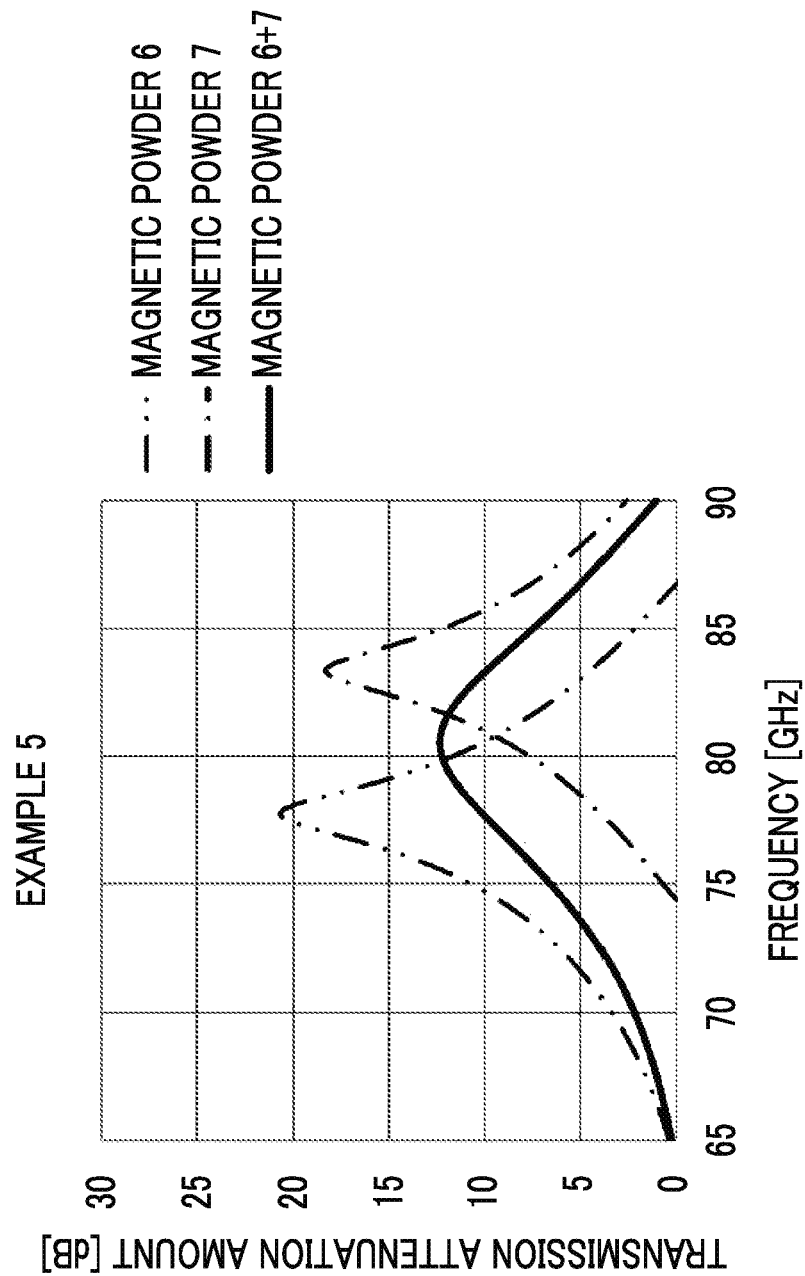

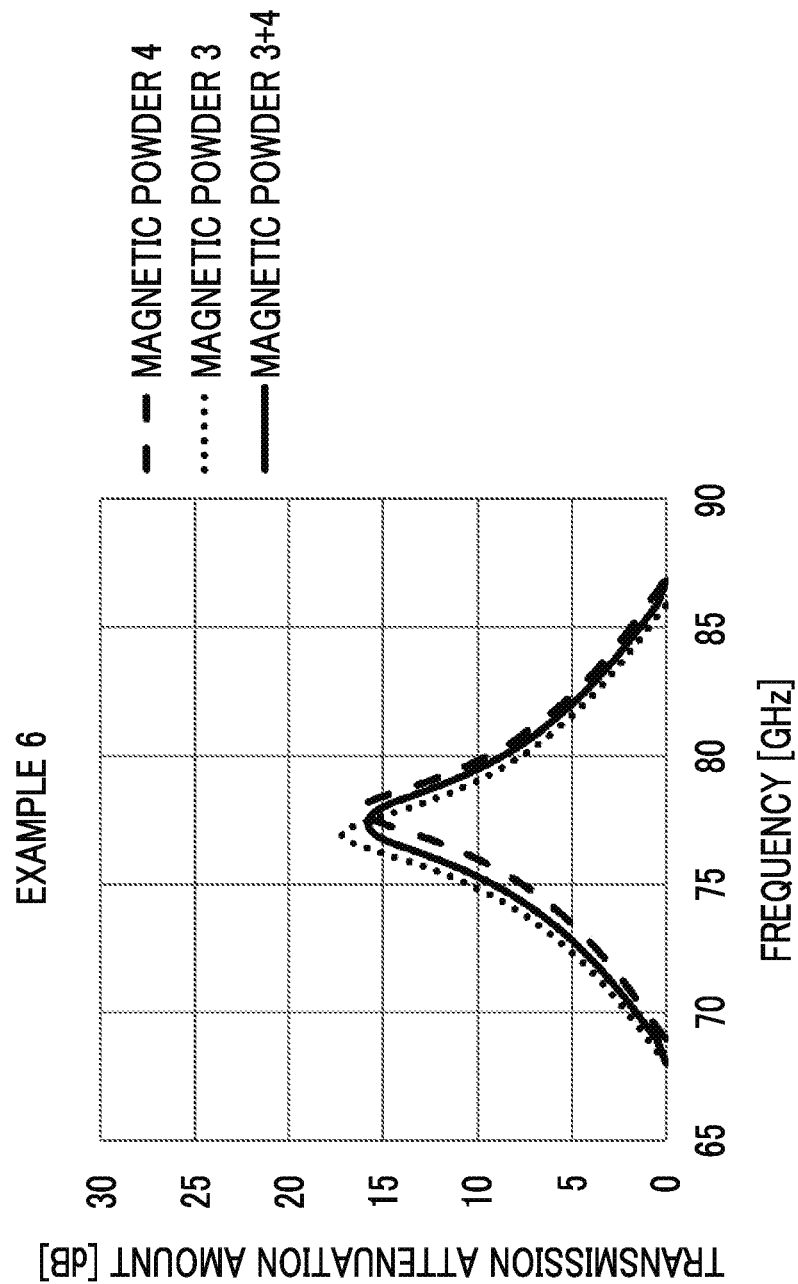

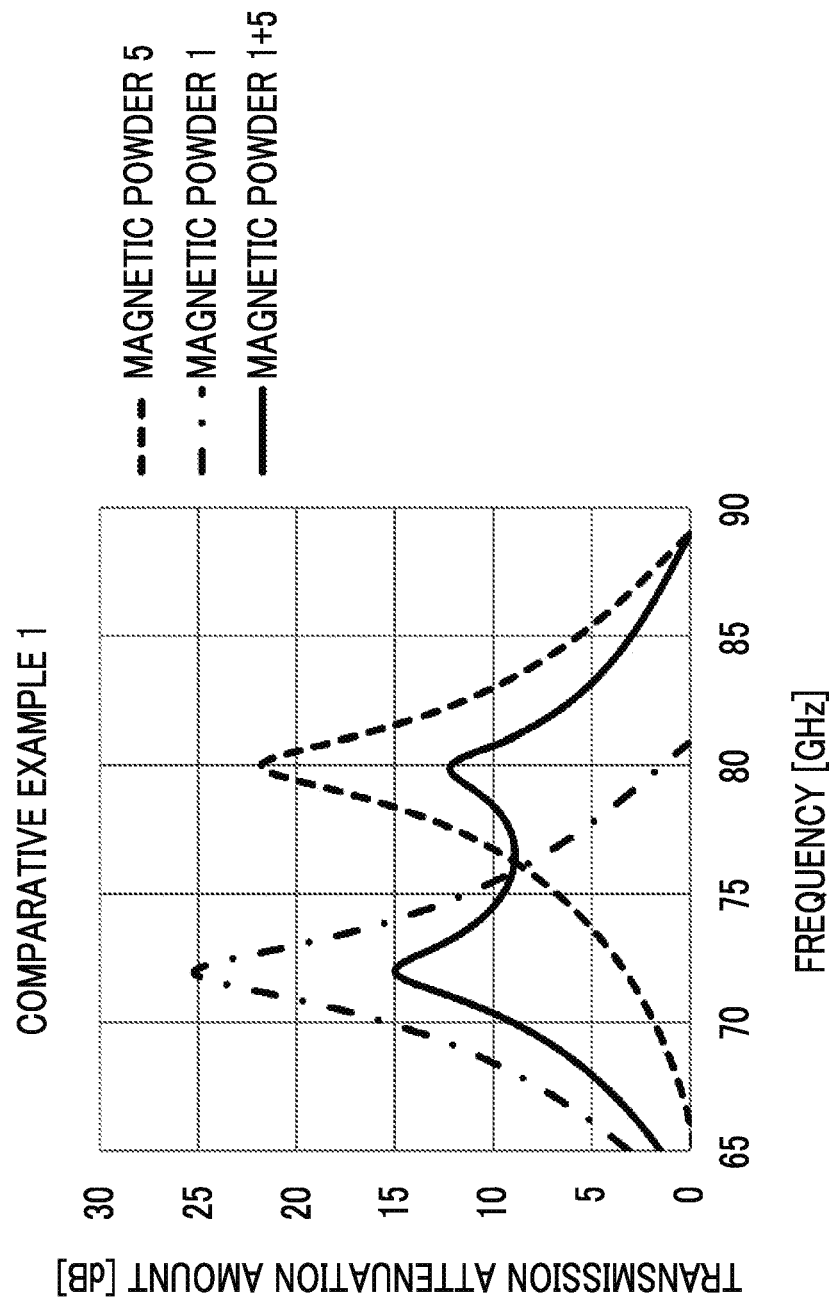

POWDER MIXTURE OF MAGNETOPLUMBITE-TYPE HEXAGONAL FERRITE, METHOD FOR PRODUCING THE SAME, AND RADIO WAVE ABSORBER

CROSS-REFERENCE TO RELATED APPLICATIONS

This application is a continuation application of International Application No. PCT/JP2019/022008, filed Jun. 3, 2019, the disclosure of which is incorporated herein by reference in its entirety. Further, this application claims priority from Japanese Patent Application No. 2018-159193, filed Aug. 28, 2018, and Japanese Patent Application No. 2019-098736, filed May 27, 2019, the disclosures of which are incorporated herein by reference in their entirety.

BACKGROUND OF THE INVENTION

1. Field of the Invention

The present disclosure relates to a powder mixture of a magnetoplumbite-type hexagonal ferrite, a method for producing the same, and a radio wave absorber.

2. Description of the Related Art

In recent years, along with the diversification of the use of radio waves in high frequency bands, such as electronic toll collection systems (ETC), advanced cruise-assist highway systems (AHS), and satellite broadcasting, malfunctions and failures of electronic devices due to radio wave interference have been problems. In order to reduce the influence of such radio wave interference on electronic devices, a radio wave absorber absorbs unnecessary radio waves to prevent the reflection of the radio waves.

As a radio wave absorber, a radio wave absorber using a magnetic material is often used. A radio wave incident to the radio wave absorber including a magnetic material generates a magnetic field in the magnetic material. In a case where the generated magnetic field is reduced to radio wave energy, part of the energy is lost and absorbed. Accordingly, in the radio wave absorber including the magnetic material, a frequency band in which the effect is obtained differs depending on the type of the magnetic material used.

For example, JP4674380B discloses a magnetic powder for a radio wave absorber in which a peak particle size of laser diffraction scattering particle size distribution is 10 μm or more in a powder of a magnetoplumbite-type hexagonal ferrite represented by a composition formula $AFe_{(12-x)}Al_xO_{19}$, in which A is one or more of Sr, Ba, Ca, and Pb, and x is 1.0 to 2.2. According to the magnetic powder for a radio wave absorber disclosed in JP4674380B, excellent radio wave absorption performance is exhibited near 76 GHz.

SUMMARY OF THE INVENTION

With the rapid development of information and communication technologies in recent years, the usage of radio waves is expected to become increasingly diversified. Therefore, from a viewpoint of coping with radio waves with various frequencies, development of a radio wave absorber capable of exhibiting excellent radio wave absorption performance in a target frequency band is desired.

The present inventors focused on a magnetoplumbite-type hexagonal ferrite in which a part of iron is substituted with aluminum (hereinafter, also simply referred to as "magnetoplumbite-type hexagonal ferrite") as a magnetic material suitable for a radio wave absorber. However, the radio wave absorber formed of the powder of the magnetoplumbite-type hexagonal ferrite has excellent radio wave absorption performance, but has a narrow bandwidth. Accordingly, it was extremely difficult to adjust a peak frequency of the magnetoplumbite-type hexagonal ferrite to a target frequency band. In addition, a radio wave absorber that uses magnetic resonance generally has a narrow bandwidth. Therefore, according to the radio wave absorber formed of the powder of the magnetoplumbite-type hexagonal ferrite, it was difficult to realize excellent radio wave absorption performance, for example, in a range of 79 GHz band millimeter wave radar (bandwidth: 4 GHz, 77 GHz to 81 GHz) which has proposed recently.

An object of one aspect of the invention is to provide a powder mixture of a magnetoplumbite-type hexagonal ferrite capable of producing a radio wave absorber having excellent radio wave absorption performance in a wider frequency band than in the related art.

In addition, an object of another aspect of the invention is to provide a method for producing a powder mixture of a magnetoplumbite-type hexagonal ferrite capable of producing a radio wave absorber having excellent radio wave absorption performance in a wider frequency band than in the related art.

Furthermore, an object of still another embodiment of the invention is to provide a radio wave absorber exhibiting excellent radio wave absorption performance even in a wider frequency band than in the related art.

A unit for achieving the objects includes the following aspects.

<1> A powder mixture of a magnetoplumbite-type hexagonal ferrite, in which the powder mixture is a mixture of powders of two or more kinds of compounds represented by Formula (1), the two or more kinds of compounds represented by Formula (1) are two or more kinds of compounds having different values of x in Formula (1), and in the two or more kinds of compounds having different values of x in Formula (1), in a case where a maximum value of x is defined as $x_{max}$ and a minimum value of x is defined as $x_{min}$, a relationship of $x_{max} - x_{min} \leq 0.2$ is satisfied.

$$AFe_{(12-x)}Al_xO_{19} \qquad \text{Formula (1)}$$

In Formula (1), A represents at least one metal element selected from the group consisting of Sr, Ba, Ca, and Pb, and x satisfies $1.5 \leq x \leq 8.0$.

<2> The powder mixture of a magnetoplumbite-type hexagonal ferrite according to <1>, in which a relationship of $X_{max} - X_{min} \leq 0.15$ is satisfied.

<3> The powder mixture of a magnetoplumbite-type hexagonal ferrite according to <1> or <2>, in which each of the two or more kinds of compounds represented by Formula (1) has a single crystal phase.

<4> The powder mixture of a magnetoplumbite-type hexagonal ferrite according to any one of <1> to <3>, in which the powder of the magnetoplumbite-type hexagonal ferrite is used for a radio wave absorber.

<5> A method for producing the powder mixture of a magnetoplumbite-type hexagonal ferrite according to any one of <1> to <4>, the method including:

a step of preparing powders of two or more kinds of compounds having different values of x in Formula (1); and a step of mixing the prepared powders of two or more kinds of compounds having different values of x in Formula (1) so that a relationship of $x_{max}-x_{min}\leq 0.2$ is satisfied, in a case where a maximum value of x is defined as $x_{max}$ and a minimum value of x is defined as $x_{min}$, in two or more kinds of compounds having different values of x in Formula (1).

<6> A radio wave absorber including: the powder mixture of a magnetoplumbite-type hexagonal ferrite according to any one of <1> to <4>; and a binder.

According to one aspect of the invention, a powder mixture of a magnetoplumbite-type hexagonal ferrite capable of producing a radio wave absorber having excellent radio wave absorption performance in a wider frequency band than in the related art is provided.

In addition, according to another aspect of the invention, a method for producing a powder mixture of a magnetoplumbite-type hexagonal ferrite capable of producing a radio wave absorber having excellent radio wave absorption performance in a wider frequency band than in the related art is provided.

Further, according to still another embodiment of the invention, a radio wave absorber exhibiting excellent radio wave absorption performance in a wider frequency band than in the related art is provided.

BRIEF DESCRIPTION OF THE DRAWINGS

FIG. 1A is a graph showing a relationship between a frequency band and a transmission attenuation amount of a radio wave absorber of Example 1.

FIG. 1B is a graph showing a relationship between a frequency band and a transmission attenuation amount of a radio wave absorber of Example 2.

FIG. 1C is a graph showing a relationship between a frequency band and a transmission attenuation amount of a radio wave absorber of Example 3.

FIG. 1D is a graph showing a relationship between a frequency band and a transmission attenuation amount of a radio wave absorber of Example 4.

FIG. 1E is a graph showing a relationship between a frequency band and a transmission attenuation amount of a radio wave absorber of Example 5.

FIG. 1F is a graph showing a relationship between a frequency band and a transmission attenuation amount of a radio wave absorber of Example 6.

FIG. 1G is a graph showing a relationship between a frequency band and a transmission attenuation amount of a radio wave absorber of Comparative Example 1.

DESCRIPTION OF THE PREFERRED EMBODIMENTS

Hereinafter, an example of an embodiment of a powder mixture of a magnetoplumbite-type hexagonal ferrite to which the invention is applied will be described. Here, the invention is not limited to the embodiments hereinafter, and modifications can be suitably added within the range of the object of the invention.

A range of numerical values shown using "to" in the disclosure means a range including numerical values before and after "to" as a minimum value and a maximum value.

In the range of numerical values disclosed in stepwise in the disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the disclosure, an upper limit value and a lower limit value disclosed in a certain range of numerical values may be replaced with values shown in examples.

In the disclosure, a combination of two or more preferred aspects is a more preferred aspect.

In the disclosure, in a case where plural kinds of substances corresponding to each component are present, an amount of each component means the amount of all of the plural kinds of substances, unless otherwise noted.

In the disclosure, a term "step" does not only mean an individual step, but also include a case a step cannot be clearly differentiated from another step, in a case where the desired object of the step is achieved.

In the disclosure, a "powder" means an aggregate of particles.

[Powder Mixture of Magnetoplumbite-Type Hexagonal Ferrite]

A powder mixture of a magnetoplumbite-type hexagonal ferrite (hereinafter, also simply referred to as a "powder mixture") of the disclosure is a mixture of powders of two or more kinds of compounds represented by Formula (1). The two or more kinds of compounds represented by Formula (1) are two or more kinds of compounds having different values of x in Formula (1), and are a powder mixture satisfying a relationship of $x_{max}-x_{min}\leq 0.2$, in a case where a maximum value of x is defined as $x_{max}$ and a minimum value of x is defined as $x_{min}$, in two or more kinds of compounds having different values of x in Formula (1).

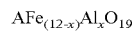

$$AFe_{(12-x)}Al_xO_{19} \qquad \text{Formula (1)}$$

In Formula (1), A represents at least one metal element selected from the group consisting of Sr, Ba, Ca, and Pb, and x satisfies $1.5\leq x\leq 8.0$.

As described above, with the rapid development of information and communication technologies in recent years, from a viewpoint of coping with radio waves with various frequencies, development of a radio wave absorber capable of exhibiting excellent radio wave absorption performance in a target frequency band is desired.

The present inventors focused on a magnetoplumbite-type hexagonal ferrite in which a part of iron is substituted with aluminum as a magnetic material suitable for a radio wave absorber. However, the radio wave absorber formed of the powder of the magnetoplumbite-type hexagonal ferrite has excellent radio wave absorption performance, but has a narrow bandwidth. Accordingly, it was extremely difficult to adjust a peak frequency of the magnetoplumbite-type hexagonal ferrite to a target frequency band. In addition, a radio wave absorber that uses magnetic resonance generally has a narrow bandwidth. Therefore, according to the radio wave absorber formed of the magnetoplumbite-type hexagonal ferrite, it was difficult to realize excellent radio wave absorption performance, for example, in a range of 79 GHz band millimeter wave radar (bandwidth: 4 GHz, 77 GHz to 81 GHz) which has proposed recently.

In contrast, according to the powder mixture of the disclosure, a radio wave absorber exhibiting excellent radio wave absorption performance in a wider frequency band than in the related art can be produced.

A peak frequency of the compound represented by Formula (1) (that is, magnetoplumbite-type hexagonal ferrite; hereinafter also referred to as "magnetoplumbite-type hexagonal ferrite") changes, in a case where a ratio of Al atoms to Fe atoms [that is, value of x in Formula (1)] changes. Specifically, in a case where the ratio of Al atoms to Fe atoms [that is, value of x in formula (1)] increases, the peak frequency of the magnetoplumbite-type hexagonal ferrite shifts to a higher frequency band.

The powder mixture of the disclosure is a mixture of powders of two or more kinds of compounds represented by Formula (1), and the two or more kinds of compounds are two or more kinds of compounds having different values of x in Formula (1). That is, the powder mixture of the disclosure is a powder mixture of two or more kinds of magnetoplumbite-type hexagonal ferrites having different peak frequencies.

In the disclosure, by focusing on the relationship between the value of x in Formula (1) and the peak frequency, two or more kinds of powders of magnetoplumbite-type hexagonal ferrite having different values of x in Formula (1), that is, different peak frequencies are mixed with each other, thereby realizing a radio wave absorber having a wider bandwidth, compared to a case of using a powder of a magnetoplumbite-type hexagonal ferrite having a single composition of the related art.

In addition, in the disclosure, in the two or more kinds of compounds having different values of x in Formula (1), in a case where a maximum value of x is defined as $x_{max}$ and a minimum value of x is defined as $x_{min}$, a relationship of $x_{max}-x_{min} \leq 0.2$ is satisfied, thereby realizing a radio wave absorber exhibiting excellent radio wave absorption performance in a wide frequency band.

A powder mixture that does not satisfy the relationship of $x_{max}-x_{min} \leq 0.2$ can expand the bandwidth of the radio wave absorber, but cannot realize a radio wave absorber exhibiting radio wave absorption performance in a continuous wide frequency band. (for example, see Comparative Example 1 which will be described later).

In addition, in contrast to the powder mixture of the disclosure, a magnetic powder for a radio wave absorber disclosed in JP4674380B is a powder having a single composition. Therefore, it is difficult to realize a radio wave absorber exhibiting excellent radio wave absorption performance in a wide frequency band like the powder mixture of the disclosure.

Hereinafter, the powder mixture of the disclosure will be described in detail.

The powder mixture of the disclosure is a mixture of powders of two or more kinds of compounds represented by Formula (1). The two or more kinds of compounds represented by Formula (1) are two or more kinds of compounds having different values of x in Formula (1), and are a powder mixture satisfying a relationship of $x_{max}-x_{min} \leq 0.2$, in a case where a maximum value of x is defined as $x_{max}$ and a minimum value of x is defined as $x_{min}$, in two or more kinds of compounds having different values of x in Formula (1).

the powder mixture of the disclosure satisfies the relationship of $x_{max}-x_{min} \leq 0.2$, thereby producing a radio wave absorber exhibiting excellent radio wave absorption performance in a wider frequency band than in the related art.

The powder mixture of the disclosure preferably satisfies a relationship of $X_{max}-x_{min} \leq 0.15$ and more preferably satisfies a relationship of $x_{max} \leq 0.1$.

In addition, the powder mixture of the disclosure preferably satisfies a relationship of $0.03 \leq x_{max}-x_{min}$ and more preferably satisfies a relationship of $0.05 \leq x_{max}-x_{min}$.

The kind of the compound represented by Formula (1) is not particularly limited, as long as the value of x in Formula (1) are two or more different from each other and the relationship of $x_{max}-x_{min} \leq 0.2$ is satisfied, and for example, the number of kinds thereof is preferably 2 to 3, from a viewpoint of manufacturing suitability.

The two or more kinds of compounds represented by Formula (1) may be the same or different, except that the value of x in Formula (1) is different.

The two or more kinds of compounds represented by Formula (1) may have the same composition (type and number of metal elements) or may have different compositions, and for example, preferably has the same composition, from a viewpoint of easily adjusting to a target frequency band.

Each of the two or more kinds of compounds represented by Formula (1) preferably has a single crystal phase, from a viewpoint of easily adjusting to the target frequency band, for example.

A proportion of each powder in the powder mixture of the disclosure is not particularly limited, and can be appropriately adjusted, for example, in consideration of the peak frequency, radio wave absorption properties, magnetic properties, and the like of each powder according to the target frequency band.

The proportion of each powder in the powder mixture of the disclosure is preferably equal in mass ratio, for example, from a viewpoint of easily adjusting to the target frequency band.

Each powder in the powder mixture of the disclosure is a powder of the compound represented by Formula (1).

Regarding A in Formula (1), the kind or number of metal elements are not particularly limited as long as A is at least one metal element selected from the group consisting of Sr, Ba, Ca, and Pb.

For example, from a viewpoint of operability and handleability, A in Formula (1) is preferably at least one metal element selected from the group consisting of Sr, Ba, and Ca.

In addition, A in Formula (1) preferably contains Sr and is more preferably Sr, from a viewpoint that a radio wave absorber exhibiting excellent radio wave absorption performance near 79 GHz can be produced.

x in Formula (1) satisfies $1.5 \leq x \leq 8.0$, preferably satisfies $1.5 \leq x \leq 6.0$, more preferably satisfies $1.5 \leq x \leq 4.0$, and even more preferably satisfies $1.5 \leq x \leq 3.0$.

In a case where x in Formula (1) is 1.5 or more, radio waves in a frequency band higher than 60 GHz can be absorbed.

In addition, in a case where x in Formula (1) is 8.0 or less, the magnetoplumbite-type hexagonal ferrite has magnetism.

Examples of the compound represented by Formula (1) (that is, magnetoplumbite-type hexagonal ferrite) include $SrFe_{(10.44)}Al_{(1.56)}O_{19}$, $SrFe_{(10.13)}Al_{(1.87)}O_{19}$, $SrFe_{(10.07)}Al_{(1.93)}O_{19}$, $SrFe_{(10.00)}Al_{(2.00)}O_{19}$, $SrFe_{(9.97)}Al_{(2.03)}O_{19}$, $SrFe_{(9.94)}Al_{(2.06)}O_{19}$, $SrFe_{(9.95)}Al_{(2.05)}O_{19}$, $SrFe_{(9.88)}Al_{(2.12)}O_{19}$, $SrFe_{(9.85)}Al_{(2.15)}O_{19}$, $SrFe_{(9.79)}Al_{(2.21)}O_{19}$, $SrFe_{(9.74)}Al_{(2.26)}O_{19}$, $SrFe_{(9.58)}Al_{(2.42)}O_{19}$, $SrFe_{(9.37)}Al_{(2.63)}O_{19}$, $SrFe_{(9.33)}Al_{(2.67)}O_{19}$, $SrFe_{(9.27)}Al_{(2.73)}O_{19}$, $SrFe_{(7.88)}Al_{(4.12)}O_{19}$, $SrFe_{(7.70)}Al_{(4.29)}O_{19}$, $SrFe_{(7.37)}Al_{(4.63)}O_{19}$, $SrFe_{(7.04)}Al_{(4.96)}O_{19}$, $SrFe_{(6.25)}Al_{(5.75)}O_{19}$, $BaFe_{(9.50)}Al_{(2.50)}O_{19}$, $BaFe_{(10.05)}Al_{(1.95)}O_{19}$, $CaFe_{(10.00)}Al_{(2.00)}O_{19}$, $PbFe_{(9.00)}Al_{(3.00)}O_{19}$, $Sr_{(0.80)}Ba_{(0.10)}Ca_{(0.10)}Fe_{(9.83)}Al_{(2.17)}O_{19}$, $Sr_{(0.80)}Ba_{(0.10)}Ca_{(0.10)}Fe_{(9.66)}Al_{(2.34)}O_{19}$, and $Sr_{(0.80)}Ba_{(0.10)}Ca_{(0.10)}Fe_{(8.85)}Al_{(3.15)}O_{19}$.

The composition of the magnetoplumbite-type hexagonal ferrite is confirmed by high frequency inductively coupled plasma (ICP) emission spectroscopy.

Specifically, a pressure-resistant container containing 12 mg of sample powder and 10 mL of a 4 mol/L (liter; the same applies hereinafter) hydrochloric acid aqueous solution is held in an oven at a set temperature of 120° C. for 12 hours to obtain a solution. Next, 30 mL of pure water is added to the obtained solution, which is then filtered using a 0.1 μm membrane filter. Elemental analysis of the filtrate obtained as described above is performed using a high frequency inductively coupled plasma (ICP) emission spectrometer. Based on the obtained elemental analysis results, a content of each metal atom with respect to 100 atom % of iron atoms is obtained. The composition is confirmed based on the obtained content.

As the ICP emission spectrometer, for example, ICPS-8100 (model number) manufactured by Shimadzu Corporation can be suitably used. However, the ICP emission spectrometer is not limited thereto.

In the disclosure, a crystal phase of the magnetoplumbite-type hexagonal ferrite may or may not be a single phase, but is preferably a single phase.

In a case where a content of aluminum is the same, the powder mixture of the magnetoplumbite-type hexagonal ferrite with a single crystal phase tends to have high coercivity and more excellent magnetic properties, compared to a powder mixture of a magnetoplumbite-type hexagonal ferrite not having a single crystal phase (for example, having two crystal phases).

In the disclosure, the expression "the crystal phase is a single phase" indicates that only one kind of diffraction pattern showing a crystal structure of magnetoplumbite-type hexagonal ferrite having any composition is observed in powder X-ray diffraction (XRD) measurement.

On the other hand, in the disclosure, the expression "the crystal phase is not a single phase" indicates that there is such a case where a plurality of magnetoplumbite-type hexagonal ferrites of any composition are mixed, and two or more kinds of diffraction patterns are observed or diffraction patterns of crystal other than the magnetoplumbite-type hexagonal ferrite are observed.

In a case where the crystal phase is not a single phase, a diffraction pattern having a main peak and other peaks is obtained. Here, the "main peak" refers to a peak having the highest value of diffraction intensity in the observed diffraction pattern.

In a case where the powder mixture of the disclosure includes a powder of a magnetoplumbite-type hexagonal ferrite that is not a single phase, a ratio (Is/Im) of a value of the diffraction intensity of the other peak (hereinafter, referred to as "Is") to a value of the main peak (hereinafter, referred to as "Im") obtained by powder X-ray diffraction (XRD) measurement is, for example, preferably ½ or less more preferably ⅓ or less, from a viewpoint of producing a radio wave absorber having more excellent radio wave absorption performance.

In a case where two or more types of diffraction patterns are overlapped with each other and the peaks of the diffraction patterns have maximum values, the respective maximum values are defined as Im and Is, and the ratio thereof is obtained. In addition, in a case where two or more types of diffraction patterns are overlapped with each other and the other peak is observed as a shoulder of the main peak, the maximum intensity value of the shoulder is defined as Is and the ratio thereof is obtained.

In addition, in a case where there are two or more other peaks, a total value of the respective diffraction intensities is defined as Is, and the ratio thereof is obtained.

For the attribute of the diffraction pattern, for example, a database of the International Centre for Diffraction Data (ICDD: registered trademark) can be referred to.

For example, for the diffraction pattern of the magnetoplumbite-type hexagonal ferrite containing Sr, "00-033-1340" of the International Center for Diffraction Data (ICDD) can be referred to. However, in a case where a part of iron is substituted with aluminum, the peak position shifts.

As described above, the single crystal phase of the magnetoplumbite-type hexagonal ferrite is confirmed by the powder X-ray diffraction (XRD) measurement.

Specifically, a method of performing the measurement by using a powder X-ray diffractometer under the following conditions is used.

As the powder X-ray diffractometer, for example, an X'Pert Pro MPD (product name) manufactured by PANalytical can be suitably used. However, the powder X-ray diffractometer is not limited thereto.

—Conditions—

X-ray source: CuKα ray
[Wavelength: 1.54 Å (0.154 nm), output: 40 mA, 45 kV]
Scan range: 20°<2θ<70°
Scan interval: 0.05°
Scan speed: 0.75°/min The shape of the particles each configuring the powder mixture of the disclosure is not particularly limited, and examples thereof include a plate shape and an irregular shape.

A particle size of individual particles constituting the powder mixture of the disclosure is not particularly limited.

In the powder mixture of the disclosure, for example, a diameter ($D_{50}$) at a cumulative percentage of 50% in a particle size distribution based on number measured by a laser diffraction scattering method may be 2 μm to 100 μm.

Specifically, the diameter ($D_{50}$) at a cumulative percentage of 50% of the powder mixture of the disclosure is a value measured by the following method.

500 mL of cyclohexanone is added to 10 mg of the powder mixture of the disclosure and diluted, stirred using a shaker for 30 seconds, and the obtained liquid is set as a sample for particle size distribution measurement. Then, the particle size distribution is measured by the laser diffraction scattering method using the sample for particle size distribution measurement. A laser diffraction/scattering particle size distribution measurement device is used as the measurement device.

As the laser diffraction/scattering particle size distribution measurement device, for example, Partica LA-960 (product name) manufactured by Horiba, Ltd. can be suitably used. However, the laser diffraction/scattering particle size distribution measurement device is not limited thereto.

A coercivity (Hc) of the powder mixture of the disclosure is preferably 400 kA/m or more, more preferably 500 kA/m or more, and even more preferably 600 kA/m or more.

In a case where the coercivity (Hc) of the powder mixture of the disclosure is 400 kA/m or more, it is possible to produce a radio wave absorber exhibiting excellent radio wave absorption performance even in a high frequency band.

The upper limit of the coercivity (Hc) of the powder mixture of the disclosure is not particularly limited, and for example, is preferably 1,500 kA/m or less.

A saturation magnetization (as) per unit mass of the powder mixture of the disclosure is preferably 10 $Am^2$/kg or more, more preferably 20 $Am^2$/kg or more, and even more preferably 30 $Am^2$/kg or more.

In a case where the saturation magnetization (as) per unit mass of the powder mixture of the disclosure is 10 $Am^2$/kg or more, it is possible to produce a radio wave absorber having more excellent radio wave absorption performance.

The upper limit of the saturation magnetization (σs) per unit mass of the powder mixture of the disclosure is not particularly limited, and is preferably, for example, 60 Am²/kg or less.

The coercivity (Hc) and saturation magnetization (δs) per unit mass of the powder mixture are values measured using a vibrating sample magnetometer under an environment of an atmosphere temperature of 23° C. and conditions of a maximum applied magnetic field of 3,589 kA/m and a magnetic field sweep speed of 1.994 kA/m/s (second).

As the vibrating sample magnetometer, for example, TM-TRVSM5050-SMSL (product name) manufactured by Tamagawa Manufacturing Co., Ltd. can be suitably used. However, the vibrating sample magnetometer is not limited thereto.

A ratio of a powder other than the magnetoplumbite-type hexagonal ferrite powder in the entire powder mixture of the disclosure is, for example, preferably 20 mass % or less, more preferably 10 mass % or less, even more preferably 5 mass % or less, particularly preferably 0 mass % or less, that is, not to include the powder other than the powder of magnetoplumbite-type hexagonal ferrite, from a viewpoint of producing a radio wave absorber having more excellent radio wave absorption performance.

<Use of Powder Mixture>

The powder mixture of the disclosure is suitably used for a radio wave absorber.

According to the powder mixture of the disclosure, it is possible to produce a radio wave absorber exhibiting excellent radio wave absorption performance in a wider frequency band, compared to the powder of magnetoplumbite-type hexagonal ferrite having a single composition of the related art.

[Method for Producing Powder Mixture]

The method for producing the powder mixture of the disclosure is not particularly limited.

The powder mixture of the disclosure can be produced by a producing method including, for example, a step of preparing powders of two or more kinds of compounds having different values of x in Formula (1) (hereinafter, also referred to as a "preparation step"), and a step of mixing the prepared powders of two or more kinds of compounds having different values of x in Formula (1) so that a relationship of $x_{max}-x_{min} \leq 0.2$ is satisfied, in a case where a maximum value of x is defined as $x_{max}$ and a minimum value of x is defined as $x_{min}$, in two or more kinds of compounds having different values of x in Formula (1) (hereinafter, also referred to as a "mixing step").

<Preparation Step>

The preparation step is a step for convenience, and is a step of preparing powders of two or more kinds of compounds having different values of x in Formula (1).

The preparation step may be a step of simply preparing powders of two or more kinds of compounds having different values of x in Formula (1) produced in advance, or a step of producing powders of two or more kinds of compounds having different values of x in Formula (1).

In a case where the preparation step is the step of producing powders of two or more kinds of compounds having different values of x in Formula (1), the preparation step is not particularly limited.

The preparation step may be, for example, a step of producing powders of two or more kinds of compounds having different values of x in Formula (1) by a solid-phase method, or a step of producing powders of two or more kinds of compounds having different values of x in Formula (1) by a liquid phase method.

Examples of the method for producing the powders of two or more kinds of compounds having different values of x in Formula (1) by the solid-phase method include a method using $SrCO_3$, $Al_2O_3$, $\alpha\text{-}Fe_2O_3$, or the like as a raw material, and the like. For a general method for producing the powders of two or more kinds of compounds having different values of x in Formula (1) by the solid-phase method, paragraphs [0023] to [0025] of JP4674380B can be suitably referred to.

The preparation step is preferably the step of producing powders of two or more kinds of compounds having different values of x in Formula (1) by the liquid phase method, from a viewpoint of easily obtaining powders having more excellent magnetic properties, and is preferably include a step A to a step C which will be described below.

The step A, the step B, and the step C may each be divided into two or more stages.

In addition, the preparation step may include steps other than the step A, the step B, and the step C.

Step A: a step of obtaining a reaction product containing Fe, Al, and at least one metal element selected from the group consisting of Sr, Ba, Ca, and Pb (hereinafter, also referred to as a "specific metal element") by a liquid phase method.

Step B: a step of drying the reaction product obtained in the step A, thereby obtaining a dried product Step C: a step of firing the dried product obtained in Step B, thereby obtaining a fired product (Step A)

The step A is a step of obtaining a reaction product containing Fe, Al, and at least one metal element selected from the group consisting of Sr, Ba, Ca, and Pb (that is, specific metal element) by a liquid phase method.

In the step A, a reaction product serving as a precursor of the powder of magnetoplumbite-type hexagonal ferrite can be obtained. It is surmised that the reaction product obtained in the step A is an iron hydroxide, an aluminum hydroxide, or a composite hydroxide of iron, aluminum, and the specific metal element.

The step A preferably includes a step of mixing an aqueous solution containing an Fe salt, an Al salt, and a salt of the specific metal element (hereinafter, also referred to as a "raw material aqueous solution") with an alkali aqueous solution, thereby obtaining a reaction product (hereinafter, referred to as "Step A1").

In the step A1, the raw material aqueous solution is mixed with the alkali aqueous solution to generate a precipitate of the reaction product. In the step A1, a solution containing a reaction product serving as a precursor of the powder of magnetoplumbite-type hexagonal ferrite (so-called precursor-containing solution) can be obtained.

In addition, the step A preferably includes a step of separating the reaction product from a liquid including the reaction product obtained in step A1 (hereinafter, also referred to as "step A2").

In the step A2, a reaction product serving as a precursor of the powder of magnetoplumbite-type hexagonal ferrite (that is, the reaction product in step A) can be obtained.

—Step A1—

The step A1 is a step of mixing an aqueous solution (that is, raw material aqueous solution) containing an Fe salt, an Al salt, and a salt of the specific metal element with an alkali aqueous solution, thereby obtaining a reaction product.

The salt of the Fe salt, the Al salt, and the salt of the specific metal element is not particularly limited, and for example, from viewpoints of availability and cost, water-soluble inorganic acid salts such as nitrates, sulfates, or chlorides are preferable.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salt include an aluminum chloride hexahydrate [$AlCl_3 \cdot 6H_2O$] and an aluminum nitrate nonahydrate [$Al(NO_3)_3 \cdot 9H_2O$].

Specific examples of the Sr salt include a strontium chloride hexahydrate [$SrCl_2 \cdot 6H_2O$], a strontium nitrate [$Sr(NO_3)_2$], and a strontium acetate hemihydrate [$Sr(CH_3COO)_2 \cdot 0.5H_2O$].

Specific examples of the Ba salt include a barium chloride dihydrate [$BaCl_2 \cdot 2H_2O$], a barium nitrate [$Ba(NO_3)_2$], and a barium acetate [$(CH_3COO)_2Ba$].

Specific examples of the Ca salt include a calcium chloride dihydrate [$CaCl_2 \cdot 2H_2O$], a calcium nitrate tetrahydrate [$Ca(NO_3)_2 \cdot 4H_2O$], and a calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

The alkali aqueous solution is not particularly limited, and examples thereof include a sodium hydroxide aqueous solution and a potassium hydroxide aqueous solution.

A concentration of the alkali aqueous solution is not particularly limited, and may be, for example, 0.1 mol/L to 10.0 mol/L.

The raw material aqueous solution and the alkali aqueous solution may be simply mixed with each other.

The raw material aqueous solution and the alkali aqueous solution may be mixed in their entirety at once, or the raw material aqueous solution and the alkali aqueous solution may be gradually mixed little by little. Alternatively, the mixture may be added to one of the raw material aqueous solution and the alkali aqueous solution while the other is added little by little.

For example, from a viewpoint of reproducibility of the radio wave absorption performance, it is preferable that the raw material aqueous solution and the alkali aqueous solution are gradually mixed little by little.

The method of mixing the raw material aqueous solution and the alkali aqueous solution is not particularly limited, and examples thereof include a method of mixing by stirring.

A stirring unit is not particularly limited, and a general stirring tool or a stirring device can be used.

The stirring time is not particularly limited as long as the reaction of the components to be mixed is completed, and can be appropriately set according to the composition of the raw material aqueous solution, the type of the stirring tool or the stirring device, and the like.

The temperature at which the raw material aqueous solution and the alkali aqueous solution are mixed is, for example, preferably 100° C. or lower from a viewpoint of preventing bumping, and more preferably 95° C. or lower and even more preferably 15° C. to 92° C. from a viewpoint of obtaining a good reaction product.

A unit for adjusting the temperature is not particularly limited, and a general heating device, cooling device, or the like can be used.

The pH at 25° C. of the aqueous solution obtained by mixing the raw material aqueous solution and the alkali aqueous solution is, for example, preferably from 5 to 13, more preferably from 6 to 12, even more preferably 8 to 12, and particularly preferably 8.5 to 12, from a viewpoint of more easily obtaining a reaction product.

By adjusting the pH of the raw material aqueous solution by mixing the raw material aqueous solution and the alkali aqueous solution, the value of x in the compound represented by Formula (1) finally obtained (that is, ratio of Al atoms to Fe atoms in the magnetoplumbite-type hexagonal ferrite) can be controlled.

By increasing the adjustment pH of the raw material aqueous solution to exceed 8.0, the value of x in the compound represented by Formula (1) finally obtained (that is, ratio of Al atoms to Fe atoms in the magnetoplumbite-type hexagonal ferrite) can be decreased.

The adjustment pH of the raw material aqueous solution is a value measured using a pH meter.

As the pH meter, for example, a tabletop pH meter F-71 (product name) manufactured by HORIBA, Ltd. can be preferably used. However, the pH meter is not limited to this.

A mixing ratio of the raw material aqueous solution and the alkali aqueous solution is not particularly limited, and for example, can be suitably set according to the desired adjustment pH of the raw material aqueous solution.

—Step A2—

Step A2 is a step of separating the reaction product from a liquid including the reaction product obtained in step A1.

In the step A2, a reaction product serving as a precursor of the powder of magnetoplumbite-type hexagonal ferrite (that is, the reaction product in step A) can be obtained.

The method of separating the reaction product from the liquid including the reaction product is not particularly limited, and examples thereof include decantation, centrifugal separation, and filtration (suction filtration, pressure filtration, and the like).

In a case where the method of separating the reaction product from the liquid including the reaction product is centrifugal separation, the conditions for centrifugal separation are not particularly limited. For example, centrifugal separation is preferably performed at a rotation speed of 2,000 revolutions per minute (rpm; the same applies hereinafter) for 3 minutes to 30 minutes. The centrifugal separation may be performed a plurality of times.

(Step B)

The step B is a step of drying the reaction product obtained in the step A, thereby obtaining a dried product (so-called precursor powder).

In a case of using the reaction product obtained in the step A for producing the radio wave absorber by drying before firing, the reproducibility of the radio wave absorption performance of the produced radio wave absorber tends to be excellent.

The drying unit is not particularly limited, and examples thereof include a dryer such as an oven.

The drying temperature is not particularly limited, and is, for example, preferably 50° C. to 200° C. and more preferably from 70° C. to 150° C.

The drying time is not particularly limited, and for example, is preferably 2 hours to 50 hours and more preferably 5 hours to 30 hours.

(Step C)

Step C: a step of firing the dried product obtained in Step B, thereby obtaining a fired product In step C, the dried product obtained in step B is fired, thereby obtaining a fired product which is the powder of the magnetoplumbite-type hexagonal ferrite.

The Firing can be performed using a heating device.

The heating device is not particularly limited as long as it can heat to a target temperature, and any well-known heating device can be used. As the heating device, for example, in addition to an electric furnace, a firing device uniquely produced according to a production line can be used.

The firing is preferably performed in the atmosphere.

The firing temperature is not particularly limited, and is, for example, preferably 900° C. or higher, more preferably 900° C. to 1,400° C., and even more preferably 1,000° C. to 1,200° C.

The firing time is not particularly limited, and is, for example, preferably 1 hour to 10 hours and more preferably 2 hours to 6 hours.

<Mixing Step>

The mixing step is a step of mixing the powders of two or more kinds of compounds having different values of x in Formula (1) prepared in the preparation step so that a relationship of $x_{max}-x_{min} \leq 0.2$ is satisfied, in a case where a maximum value of x is defined as $x_{max}$ and a minimum value of x is defined as $x_{min}$, in two or more kinds of compounds having different values of x in Formula (1).

The method of mixing the powders of two or more kinds of compounds having different values of x in Formula (1) is not particularly limited, and examples thereof include a method of mixing by stirring.

A stirring unit is not particularly limited, and a general stirring device can be used.

As the stirring device, a mixer such as a paddle mixer or an impeller mixer is used.

The stirring time is not particularly limited, and for example, can be suitably set in accordance with the kind of the stirring device, the amount of the powder to be mixed, and the like.

A mixing ratio of each powder is not particularly limited, and can be appropriately adjusted, for example, in consideration of the peak frequency, radio wave absorption properties, magnetic properties, and the like of each powder according to the target frequency band.

The mixing ratio of each powder is preferably equal in mass ratio, for example, from a viewpoint of easily adjusting to the target frequency band.

[Radio Wave Absorber]

The radio wave absorber of the disclosure includes the powder mixture of the disclosure (hereinafter, also referred to as "specific powder mixture") and a binder.

Since the radio wave absorber of the disclosure includes the specific powder mixture, it is possible to exhibit excellent radio wave absorption performance in a wider frequency band than in the related art.

In addition, in the specific powder mixture included in the radio wave absorber of the disclosure, by controlling the ratio of aluminum atoms to iron atoms (that is, the value of x in Formula (1)) in the magnetoplumbite-type hexagonal ferrite, it is possible to design the absorption wavelength of radio waves of the radio wave absorber, and it is possible to efficiently increase the absorption of radio waves at a desired frequency.

Specifically, in the radio wave absorber of the disclosure, by increasing the ratio of aluminum atoms to iron atoms in the magnetoplumbite-type hexagonal ferrite (that is, increasing a value of x in Formula (1)), radio waves in a higher frequency band can be absorbed. Accordingly, excellent radio wave absorption performance can be exhibited, even in a high frequency band of 70 GHz to 90 GHz, for example.

The radio wave absorber of the disclosure may have a planar shape, a three-dimensional shape, or a linear shape.

The planar shape thereof is not particularly limited, and examples thereof include a sheet shape and a film shape.

Examples of the three-dimensional shape include a polygonal column having a shape of a triangle or more, a column, a pyramid, a cone, a honeycomb, and the like. In addition, as the three-dimensional shape, a shape obtained by combining the above-described planar shape and the three-dimensional shape is also used.

The radio wave absorption performance of the radio wave absorber of the disclosure can be controlled not only by the content of the specific powder mixture in the radio wave absorber, but also by the shape of the radio wave absorber.

The radio wave absorber of the disclosure includes the specific powder mixture.

A content of the specific powder mixture in the radio wave absorber of the disclosure is not particularly limited, and is, for example, preferably equal to or greater than 10 mass %, more preferably equal to or greater than 30 mass %, and even more preferably equal to or greater than 50 mass % with respect to a total solid content of the radio wave absorber, from a viewpoint of ensuring excellent radio wave absorption properties.

In addition, a content of the specific powder mixture in the radio wave absorber of the disclosure is, for example, preferably equal to or less than 98 mass %, more preferably equal to or less than 95 mass %, and even more preferably equal to or less than 92 mass % with respect to a total solid content of the radio wave absorber, from viewpoints of manufacturing suitability and durability of the radio wave absorber.

In the disclosure, in a case where the radio wave absorber does not contain a solvent, the total solid content in the radio wave absorber means a total mass of the radio wave absorber, and in a case where the radio wave absorber contains a solvent, the total solid content means a total mass excluding the solvent from the radio wave absorber.

The radio wave absorber of the disclosure includes a binder.

In the disclosure, the term "binder" is a general term for a substance that can maintain the specific powder mixture in a dispersed state and form a form of a radio wave absorber.

The binder is not particularly limited, and examples thereof include a resin, rubber, or thermoplastic elastomer (TPE).

Among these, as the binder, for example, a thermoplastic elastomer (TPE) is preferable, from a viewpoint of tensile strength and bending resistance.

The resin may be either a thermoplastic resin or a thermosetting resin.

Specific examples of the thermoplastic resin include an acrylic resin; polyacetal; polyamide; polyethylene; polypropylene; polyethylene terephthalate; polybutylene terephthalate; polycarbonate; polystyrene; polyphenylene sulfide; polyvinyl chloride; an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Specific examples of the thermosetting resin include a phenol resin, an epoxy resin, a melamine resin, a urea resin, an unsaturated polyester, a diallyl phthalate resin, a urethane resin, and a silicon resin.

The rubber is not particularly limited and, for example, preferable examples thereof include synthetic rubber such as butadiene rubber; isoprene rubber; chloroprene rubber; halogenated butyl rubber; fluoro rubber; urethane rubber; acrylic rubber (ACM) obtained by copolymerization of acrylates (for example, ethyl acrylate, butyl acrylate, and 2-ethylhexyl acrylate) and other monomers; ethylene-propylene rubber obtained by coordination polymerization of ethylene and propylene using a Ziegler catalyst; butyl rubber (IIR) obtained by copolymerization of isobutylene and isoprene;

styrene butadiene rubber (SBR) obtained by copolymerization of butadiene and styrene; acrylonitrile-butadiene rubber (NBR) obtained by copolymerization of acrylonitrile and butadiene; silicone rubber, from viewpoints that mixability with specific powder mixture is good and the radio wave absorber having more excellent durability, weather resistance, and impact resistance can be produced.

Specific examples of a thermoplastic elastomer include an olefin-based thermoplastic elastomer (TPO), a styrene-based thermoplastic elastomer (TPS), an amide-based thermoplastic elastomer (TPA), and a polyester-based thermoplastic elastomer (TPC).

In a case where the radio wave absorber of the disclosure contains rubber as the binder, it may contain various additives such as a vulcanizing agent, a vulcanization aid, a softener, and a plasticizer, in addition to the rubber.

Examples of the vulcanizing agent include sulfur, an organic sulfur compound, and a metal oxide.

A melt mass flow rate (hereinafter, also referred to as "MFR") of the binder is not particularly limited, and is, for example, preferably 1 g/10 min to 200 g/10 min, more preferably 3 g/10 min to 100 g/10 min, even more preferably 5 g/10 min to 80 g/10 min, and particularly preferably 10 g/10 min to 50 g/10 min.

In a case where the MFR of the binder is 1 g/10 min or more, fluidity is sufficiently high and the poor appearance is less likely to occur.

In a case where the MFR of the binder is 200 g/10 min or less, mechanical properties such as hardness of a molded body are more easily enhanced.

The MFR of the binder is a value measured under the conditions of a measurement temperature of 230° C. and a load of 10 kg according to JIS K 7210:1999.

The hardness of the binder is not particularly limited and is for example, preferably 5 g to 150 g, more preferably 10 g to 120 g, even more preferably 30 g to 100 g, and particularly preferably 40 g to 90 g, from a viewpoint of moldability.

The hardness of the binder is an instantaneous value measured according to JIS K 6253-3:2012.

The density of the binder is not particularly limited and is, for example, 600 kg/m$^3$ to 1,100 kg/m$^3$, more preferably 700 kg/m$^3$ to 1,000 kg/m$^3$, even more preferably 750 kg/m$^3$ to 1,050 kg/m$^3$, and particularly preferably 800 kg/m$^3$ to 950 kg/m$^3$, from a viewpoint of moldability.

The density of the binder is a value measured according to JIS K 0061:2001.

A 100% tensile stress of the binder is not particularly limited, and is for example, 0.2 MPa to 20 MPa, more preferably 0.5 MPa to 10 MPa, even more preferably 1 MPa to 5 MPa, and particularly preferably 1.5 MPa to 3 MPa, from a viewpoint of moldability.

A tensile strength of the binder is not particularly limited, and is for example, 1 MPa to 20 MPa, more preferably 2 MPa to 15 MPa, even more preferably 3 MPa to 10 MPa, and particularly preferably 5 MPa to 8 MPa, from a viewpoint of moldability.

An elongation at cut of the binder is not particularly limited and is for example, preferably 110% to 1,500%, more preferably 150% to 1,000%, even more preferably 200% to 900%, and particularly preferably 400% to 800%, from a viewpoint of moldability.

The tensile properties described above are values measured according to JIS K 6251:2010. The measurement is performed using a JIS No. 3 dumbbell as a test piece under the condition of a pulling speed of 500 mm/min.

The radio wave absorber of the disclosure may include only one kind of binder and may include two or more kinds thereof.

A content of the binder in the radio wave absorber of the disclosure is not particularly limited, and is, for example, preferably equal to or greater than 2 mass %, more preferably equal to or greater than 5 mass %, and even more preferably equal to or greater than 8 mass % with respect to a total solid content of the radio wave absorber, from a viewpoint of dispersibility of the specific powder mixture and viewpoints of manufacturing suitability and durability of the radio wave absorber.

In addition, the content of the binder in the radio wave absorber is, for example, preferably equal to or smaller than 90 mass %, more preferably equal to or smaller than 70 mass %, and even more preferably equal to or smaller than 50 mass %, with respect to a total solid content of the radio wave absorber, from a viewpoint of ensuring excellent radio wave absorption properties.

The radio wave absorber of the disclosure may include various additives (so-called other additives) as necessary, in addition to the specific powder mixture and the binder.

Examples of other additives include a dispersing agent, a dispersing aid, fungicides, an antistatic agent, and an antioxidant. One component of the other additives may perform more than two functions.

The fact that the radio wave absorber contains the specific powder mixture can be confirmed, for example, by the following method.

After the radio wave absorber is finely chopped, it is immersed in a solvent (for example, acetone) for 1 or 2 days, and then dried. The structure can be confirmed by further finely grinding the dried radio wave absorber and performing powder X-ray diffraction (XRD) measurement. After cutting out the cross section of the radio wave absorber, the composition can be confirmed by using, for example, an energy dispersive X-ray analyzer.

[Method for Producing Radio Wave Absorber]

The method for producing the radio wave absorber of the disclosure is not particularly limited.

As a method for producing the radio wave absorber of the disclosure, for example, a method for producing a radio wave absorber according to the embodiment which will be described later is preferable.

The method for producing a radio wave absorber according to the embodiment includes a step I of forming a molded body using a composition for a radio wave absorber including the specific powder mixture and the binder.

<Step I>

Step I is a step of forming a molded body using a composition for a radio wave absorber including the specific powder mixture and the binder.

The molded body formed in step I forms at least a part of the radio wave absorber.

Since the specific powder mixture and the binder in step I are as described above, the description thereof is omitted here.

A content of the specific powder mixture in the composition for a radio wave absorber is not particularly limited, and is, for example, preferably equal to or greater than 10 mass %, more preferably equal to or greater than 30 mass %, and even more preferably equal to or greater than 50 mass % with respect to a total solid content of the radio wave absorber, from a viewpoint of ensuring excellent radio wave absorption properties.

In addition, a content of the specific powder mixture in the composition for a radio wave absorber is, for example, preferably equal to or less than 98 mass %, more preferably equal to or less than 95 mass %, and even more preferably equal to or less than 92 mass % with respect to a total solid content of the radio wave absorber, from viewpoints of manufacturing suitability and durability of the radio wave absorber.

In the disclosure, in a case where the composition for a radio wave absorber does not contain a solvent, the total solid content in the composition for a radio wave absorber means a total mass of the composition for a radio wave absorber, and in a case where the composition for a radio wave absorber contains a solvent, the total solid content means a total mass excluding the solvent from the composition for a radio wave absorber.

A content of the binder in the composition for a radio wave absorber is not particularly limited, and is, for example, preferably equal to or greater than 2 mass %, more preferably equal to or greater than 5 mass %, and even more preferably equal to or greater than 8 mass % with respect to a total solid content of the composition for a radio wave absorber, from a viewpoint of dispersibility of the specific powder mixture and viewpoints of manufacturing suitability and durability of the radio wave absorber.

In addition, the content of the binder in the composition for a radio wave absorber is, for example, preferably equal to or smaller than 90 mass %, more preferably equal to or smaller than 70 mass %, and even more preferably equal to or smaller than 50 mass %, with respect to a total solid content of the composition for a radio wave absorber, from a viewpoint of ensuring excellent radio wave absorption properties.

In the composition for a radio wave absorber, the specific powder mixture and the binder may be simply mixed.

The method of mixing the specific powder mixture and the binder is not particularly limited, and examples thereof include a method of mixing by stirring.

A stirring unit is not particularly limited, and a general stirring device can be used.

As the stirring device, a mixer such as a paddle mixer or an impeller mixer is used.

The stirring time is not particularly limited, and for example, can be suitably set in accordance with the kind of the stirring device or the composition of the composition for a radio wave absorber.

The method for forming the molded body is not particularly limited.

Examples for the method for forming a molded body include a method for applying the composition for a radio wave absorber onto a support and drying, a method for ejecting the composition for a radio wave absorber onto a support by using a nozzle and then drying, a method for injection molding of the composition for a radio wave absorber, and a method for press-molding the composition for a radio wave absorber.

One of the preferable embodiment of the step I is an embodiment including a step I-a1 of applying a composition for a radio wave absorber including a specific powder mixture and a binder onto a support to form a composition layer for a radio wave absorber, and a step I-a2 of drying the composition layer for a radio wave absorber formed in the step Ia-1 to form a radio wave absorption layer.

The radio wave absorption layer in the step I-a2 corresponds to the molded body in the step I.

(Step I-a1)

Step I-a1 is a step of forming a composition layer for a radio wave absorber by applying a composition for a radio wave absorber including the specific powder mixture and the binder to a support.

Since the specific powder mixture and the binder in step I-a1 are as described above, the description thereof is omitted here.

The composition for a radio wave absorber in step I-a1 preferably contains a solvent.

The solvent is not particularly limited and examples thereof include, for example, water, an organic solvent, or a mixed solvent of water and an organic solvent.

The organic solvent is not particularly limited, and examples thereof include an alcohol compound such as methanol, ethanol, n-propanol, i-propanol, or methoxypropanol, a ketone compound such as acetone, methyl ethyl ketone, cyclohexane, or cyclohexanone, tetrahydrofuran, acetonitrile, ethyl acetate, and toluene.

Among these, as the solvent, at least one kind selected from methyl ethyl ketone and cyclohexane is preferable, from viewpoints of a comparatively low boiling point and ease of drying.

In a case where the composition for a radio wave absorber includes a solvent, a content of the solvent in the composition for a radio wave absorber is not particularly limited, and is suitably set, for example, in accordance with the kind or amount of the component blended in the composition for a radio wave absorber.

The composition for a radio wave absorber may include various additives (so-called other additives) as necessary, in addition to the specific powder mixture, the binder, and the solvent.

Examples of other additives include a dispersing agent, a dispersing aid, fungicides, an antistatic agent, and an antioxidant. One component of the other additives may perform more than two functions.

The support is not particularly limited, and a well-known support can be used.

Examples of the material configuring the support include a metal plate (plate of metal such as aluminum, zinc, or copper), a plastic sheet [sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which metal described above is laminated or vapor-deposited.

The plastic sheet is preferably biaxially stretched.

The support can function to maintain the form of the radio wave absorber. In a case where the formed radio wave absorber can maintain its own form, the support may be removed from the radio wave absorber after producing the radio wave absorber, using a metal plate, a glass plate, or a plastic sheet having a surface subjected to a release treatment.

The shape, the structure, or the size of the support can be suitably selected according to the purpose.

The shape of the support is not particularly limited and is, for example, a flat plate shape.

The structure of the support may be a single-layered structure or a laminated structure of two or more layers.

A size of the support is not particularly limited and can be suitably selected, for example, according to the size of the radio wave absorber and the like.

The thickness of the support is not particularly limited, and is normally approximately 0.01 mm to 10 mm, for example, preferably 0.02 mm to 3 mm and more preferably 0.05 mm to 1 mm, from a viewpoint of handleability.

The method for applying the composition for a radio wave absorber on a support is not particularly limited, and examples thereof include methods using a die coater, a knife coater, an applicator, and the like.

A thickness of the composition layer for a radio wave absorber is not particularly limited and can be, for example, 5 μm to 5 mm.

(Step I-a2)

Step Ia-2 is a step of forming a radio wave absorption layer by drying the composition layer for a radio wave absorber formed in Step Ia-1.

The method for drying the composition layer for a radio wave absorber is not particularly limited, and examples thereof include a method using a heating device such as an oven.

The drying temperature and drying time are not particularly limited as long as the solvent in the composition layer for a radio wave absorber can be volatilized. As an example, the drying can be performed by heating at 30° C. to 150° C. for 0.01 to 2 hours.

One of the other preferable embodiments of the step I is an embodiment including a step I-b1 of kneading the specific powder mixture and the binder to obtain a kneaded product, and a step I-b2 of molding the kneaded product obtained in the step I-b1 to obtain a radio wave absorber.

The radio wave absorber in the step I-b2 corresponds to the molded body in the step I.

(Step I-b1)

Step I-b1 is a step of kneading the specific powder mixture and the binder to obtain a kneaded product.

Since the specific powder mixture and the binder in step I-b1 are as described above, the description thereof is omitted here.

In the step I-b1, a solvent and various additives (so-called other additives) may be kneaded, as necessary, in addition to the specific powder mixture and the binder.

Since the solvent and other additives in step I-b1 are as described above, the description thereof is omitted here.

A kneading unit is not particularly limited, and a general kneading device can be used.

Examples of the kneading device include devices such as a mixer, two rolls, and a kneader.

The kneading time is not particularly limited, and for example, can be suitably set in accordance with the kind of the kneading device, the kind and the amount of the components to be kneaded, and the like.

(Step I-b2)

Step I-b2 is a step of molding the kneaded product obtained in the step I-b1 to obtain a radio wave absorber.

A molding unit is not particularly limited, and examples thereof include press molding, extrusion molding, and injection molding.

The molding conditions are not particularly limited and can be suitably set according to kinds of components included in the kneaded product, the molding unit, and the like.

In a case where the molding unit is press molding using a mold, a molding pressure can be, for example, 10 MPa to 50 MPa.

A pressing temperature can be, for example, 180° C. to 220° C.

A pressing time can be, for example, 1 minute to 5 minutes.

EXAMPLES

Hereinafter, the invention will be described in detail with reference to examples, but the invention is not limited to the following examples, within a range not departing the gist thereof.

In the following examples, the pH was measured using a desktop pH meter #F-71 (product name) manufactured by Horiba, Ltd.

<Producing of Powder of Magnetoplumbite-Type Hexagonal Ferrite>

—Producing of Magnetic Powder 1—

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$AlCl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., a 1 mol/L sodium hydroxide aqueous solution was added to the first solution while maintaining the temperature so that pH is 11.5, to obtain a second solution.

Next, the second solution was stirred for 15 minutes to complete the reaction, and a solution containing a reaction product which is a precursor of the powder of magnetoplumbite-type hexagonal ferrite (that is, a precursor-containing solution) was obtained.

Next, the precursor-containing solution was subjected to centrifugal separation (rotation speed: 3,000 rpm, rotation time: 10 minutes) three times, and the resulting precipitate was collected.

Next, the collected precipitate was dried in an oven at an internal atmosphere temperature of 80° C. for 12 hours to obtain a dried product (that is, precursor powder).

Next, the powder of the precursor were put in a muffle furnace, and the temperature in the furnace was set to a temperature condition of 1,100° C. in the atmosphere, followed by firing for 4 hours, thereby obtaining a fired product. The obtained fired product was used as magnetic powder 1.

—Producing of Magnetic Powder 2—

The operation same as in the producing of the magnetic powder 1 was performed except that "after changing the temperature of the first solution to 25° C., a 1 mol/L sodium hydroxide aqueous solution was added to the first solution while maintaining the temperature so that pH is 11.5, to obtain a second solution" in the producing of the magnetic powder 1 to "after changing the temperature of the first solution to 25° C., a 1 mol/L sodium hydroxide aqueous solution was added to the first solution while maintaining the temperature so that pH is 11.3, to obtain a second solution", and accordingly, a magnetic powder 2 was obtained.

—Producing of Magnetic Powder 3—

The operation same as in the producing of the magnetic powder 1 was performed except that "after changing the temperature of the first solution to 25° C., a 1 mol/L sodium hydroxide aqueous solution was added to the first solution while maintaining the temperature so that pH is 11.5, to obtain a second solution" in the producing of the magnetic powder 1 to "after changing the temperature of the first solution to 25° C., a 1 mol/L sodium hydroxide aqueous solution was added to the first solution while maintaining the temperature so that pH is 11.0, to obtain a second solution", and accordingly, a magnetic powder 3 was obtained.

—Producing of Magnetic Powder 4—

The operation same as in the producing of the magnetic powder 1 was performed except that "after changing the temperature of the first solution to 25° C., a 1 mol/L sodium hydroxide aqueous solution was added to the first solution while maintaining the temperature so that pH is 11.5, to obtain a second solution" in the producing of the magnetic powder 1 to "after changing the temperature of the first solution to 25° C., a 1 mol/L sodium hydroxide aqueous solution was added to the first solution while maintaining the temperature so that pH is 10.7, to obtain a second solution", and accordingly, a magnetic powder 4 was obtained.

—Producing of Magnetic Powder 5—

The operation same as in the producing of the magnetic powder 1 was performed except that "after changing the temperature of the first solution to 25° C., a 1 mol/L sodium hydroxide aqueous solution was added to the first solution while maintaining the temperature so that pH is 11.5, to obtain a second solution" in the producing of the magnetic powder 1 to "after changing the temperature of the first solution to 25° C., a 1 mol/L sodium hydroxide aqueous solution was added to the first solution while maintaining the temperature so that pH is 10.5, to obtain a second solution", and accordingly, a magnetic powder 5 was obtained.

—Producing of Magnetic Powder 6—

A total amount of a raw material aqueous solution prepared by dissolving 57.0 g of iron (III) chloride hexahydrate [$FeCl_3 \cdot 6H_2O$], 22.3 g of strontium chloride hexahydrate [$SrCl_2 \cdot 6H_2O$], 2.6 g of barium chloride dihydrate [$BaCl_2 \cdot 2H_2O$], 1.5 g of calcium chloride dihydrate [$CaCl_2 \cdot 2H_2O$], and 10.2 g of aluminum chloride hexahydrate [$AlCl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., a 1 mol/L sodium hydroxide aqueous solution was added to the first solution while maintaining the temperature so that pH is 11.3, to obtain a second solution.

Next, the second solution was stirred for 15 minutes to complete the reaction, and a solution containing a reaction product which is a precursor of the powder of magnetoplumbite-type hexagonal ferrite (that is, a precursor-containing solution) was obtained.

Next, the precursor-containing solution was subjected to centrifugal separation (rotation speed: 3,000 rpm, rotation time: 10 minutes) three times, and the resulting precipitate was collected.

Next, the collected precipitate was dried in an oven at an internal atmosphere temperature of 80° C. for 12 hours to obtain a dried product (that is, precursor powder).

Next, the powder of the precursor were put in a muffle furnace, and the temperature in the furnace was set to a temperature condition of 1,100° C. in the atmosphere, followed by firing for 4 hours, thereby obtaining a fired product. The obtained fired product was used as magnetic powder 6.

—Producing of Magnetic Powder 7—

The operation same as in the producing of the magnetic powder 6 was performed except that "after changing the temperature of the first solution to 25° C., a 1 mol/L sodium hydroxide aqueous solution was added to the first solution while maintaining the temperature so that pH is 11.3, to obtain a second solution" in the producing of the magnetic powder 6 to "after changing the temperature of the first solution to 25° C., a 1 mol/L sodium hydroxide aqueous solution was added to the first solution while maintaining the temperature so that pH is 10.5, to obtain a second solution", and accordingly, a magnetic powder 7 was obtained.

1. Confirmation of Crystal Structure

The crystal structure of the magnetic material forming each magnetic powder of magnetic powder 1 to magnetic powder 7 (hereinafter, also referred to as "magnetic material 1 to magnetic material 7") was confirmed by an X-ray diffraction (XRD) method.

Specifically, it was confirmed whether or not the magnetoplumbite-type crystal structure is obtained and whether the crystal structure had a single phase or two crystal phase.

An X'Pert Pro MPD (product name) manufactured by PANalytical which is the powder X-ray diffractometer was used as a measurement device. The measurement conditions are shown below.

—Measurement Conditions—

X-ray source: CuKα ray
[Wavelength: 1.54 Å (0.154 nm), output: 40 mA, 45 kV]
Scan range: $20° < 2\theta < 70°$
Scan interval: 0.05°
Scan speed: 0.75°/min As a result, it is confirmed that each of the magnetic materials 1 to 7 is a single-phase magnetoplumbite-type hexagonal ferrite having a magnetoplumbite-type crystal structure without the crystal structure other than the magnetoplumbite type.

2. Confirmation of Composition

The composition of each magnetic material of the magnetic materials 1 to 7 was confirmed by high frequency inductively coupled plasma (ICP) emission spectroscopy.

Specifically, a pressure-resistant container (beaker) containing 12 mg of the magnetic powder and 10 mL of a 4 mol/L hydrochloric acid aqueous solution was held in an oven at a set temperature of 120° C. for 12 hours to obtain a solution. 30 mL of pure water was added to the obtained solution, which is then filtered using a 0.1 μm membrane filter. Elemental analysis of the filtrate obtained as described above was performed using a high frequency inductively coupled plasma (ICP) emission spectrometer [model number: ICPS-8100, Shimadzu Corporation].

Based on the obtained elemental analysis results, a content of each metal atom with respect to 100 atom % of iron atoms was obtained. Then, based on the obtained content, the composition of the magnetic materials was confirmed. The composition of each magnetic material is shown below.

Magnetic material 1: $SrFe_{(10.13)}Al_{(1.87)}O_{19}$
Magnetic material 2: $SrFe_{(10.07)}Al_{(1.93)}O_{19}$
Magnetic material 3: $SrFe_{(9.97)}Al_{(2.03)}O_{19}$
Magnetic material 4: $SrFe_{(9.94)}Al_{(2.06)}O_{19}$
Magnetic material 5: $SrFe_{(9.88)}Al_{(2.12)}O_{19}$
Magnetic Material 6: $Sr_{(0.80)}Ba_{(0.10)}Ca_{(0.10)}Fe_{(9.83)}Al_{(2.17)}O_{19}$
Magnetic Material 7: $Sr_{(0.80)}Ba_{(0.10)}Ca_{(0.10)}Fe_{(9.66)}Al_{(2.34)}O_{19}$ 3. Peak Frequency of Transmission Attenuation Amount The transmission attenuation amount and the peak frequency of the radio wave absorption sheets (hereinafter, also referred to as "radio wave absorption sheet 1 to radio wave absorption sheet 7") produced by using each magnetic powder of the magnetic powders 1 to 7 were measured. For the measurement, a sheet for measurement produced by the following method was used.

78 g of the magnetic powder and 26 g of an olefin-based thermoplastic elastomer (TPO) [product name: MILASTOMER (registered trademark) 7030 NS, Mitsui Chemicals, Inc., binder] were kneaded at 30 rpm for 10 minutes by using Laboplast mill [product name, Toyo Seiki Seisakusho Co., Ltd.], and a kneaded product of the magnetic powder and TPO was obtained. 40 g of the obtained kneaded product was molded under the conditions of a molding pressure: 20 MPa, a press temperature: 200° C., and a press time: 10 minutes using a heating press device to produce a measurement radio wave absorption sheet (thickness: 3 mm).

The peak frequency of the transmission attenuation amount of the radio wave absorption sheet for measurement produced above was obtained.

Specifically, as a measurement device, a transmission attenuation amount was measured at an incidence angle of 0° and in a range of 65 GHz to 90 GHz by a free space method using a vector network analyzer (product name: MS4647B) of Anritsu Corporation and a horn antenna (product name: RH19R) of Keycom Co., Ltd., and a peak frequency was obtained.

The value of x in Formula (1) in the magnetic material (that is, the magnetic material 1 to the magnetic material 7) forming each magnetic powder of the magnetic powder 1 to the magnetic powder 7 and the peak frequency of the transmission attenuation amount of the radio wave absorption sheet, in a case of using each magnetic powder of magnetic powder 1 to magnetic powder 7 alone, are shown in Table 1.

In Table 1, the "peak frequency of the transmission attenuation amount of the radio wave absorption sheet, in a case of using each magnetic powder of magnetic powder 1 to magnetic powder 7 alone" is simply noted as "peak frequency of the transmission attenuation amount".

TABLE 1

|  | Magnetic powder 1 | Magnetic powder 2 | Magnetic powder 3 | Magnetic powder 4 | Magnetic powder 5 | Magnetic powder 6 | Magnetic powder 7 |
| --- | --- | --- | --- | --- | --- | --- | --- |
| Value of x | 1.87 | 1.93 | 2.03 | 2.06 | 2.12 | 2.17 | 2.34 |
| Peak frequency of transmission attenuation amount [GHz] | 72.1 | 74.7 | 77.1 | 78.0 | 80.0 | 77.8 | 83.4 |

Production of Radio Wave Absorption Sheet

Example 1

26 g of the magnetic powder 3, 26 g of the magnetic powder 4, 26 g of the magnetic powder 5, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 3, the magnetic powder 4, the magnetic powder 5, and TPO was obtained. 40 g of the obtained kneaded product was molded under the conditions of a molding pressure: 20 MPa, a press temperature: 200° C., and a press time: 10 minutes using a heating press device to produce a radio wave absorption sheet of Example 1 (thickness: 3 mm).

Example 2

39 g of the magnetic powder 2, 39 g of the magnetic powder 5, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 2, the magnetic powder 5, and TPO was obtained. 40 g of the obtained kneaded product was molded under the conditions of a molding pressure: 20 MPa, a press temperature: 200° C., and a press time: 10 minutes using a heating press device to produce a radio wave absorption sheet of Example 2 (thickness: 3 mm).

Example 3

39 g of the magnetic powder 3, 39 g of the magnetic powder 5, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 3, the magnetic powder 5, and TPO was obtained. 40 g of the obtained kneaded product was molded under the conditions of a molding pressure: 20 MPa, a press temperature: 200° C., and a press time: 10 minutes using a heating press device to produce a radio wave absorption sheet of Example 3 (thickness: 3 mm).

Example 4

39 g of the magnetic powder 3, 39 g of the magnetic powder 4, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 3, the magnetic powder 4, and TPO was obtained. 40 g of the obtained kneaded product was molded under the conditions of a molding pressure: 20 MPa, a press temperature: 200° C., and a press time: 10 minutes using a heating press device to produce a radio wave absorption sheet of Example 4 (thickness: 3 mm).

Example 5

39 g of the magnetic powder 6, 39 g of the magnetic powder 7, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 6, the magnetic powder 7, and TPO was obtained. 40 g of the obtained kneaded product was molded under the conditions of a molding pressure: 20 MPa, a press temperature: 200° C., and a press time: 10 minutes using a heating press device to produce a radio wave absorption sheet of Example 5 (thickness: 3 mm).

Example 6

31 g of the magnetic powder 3, 31 g of the magnetic powder 4, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 3, the magnetic powder 4, and TPO was obtained. 36 g of the obtained kneaded product was molded under the conditions of a molding pressure: 20 MPa, a press temperature: 200° C., and a press time: 10 minutes using a heating press device to produce a radio wave absorption sheet of Example 6 (thickness: 3 mm).

Comparative Example 1

39 g of the magnetic powder 1, 39 g of the magnetic powder 5, and 26 g of the olefin-based thermoplastic elastomer (TPO; binder) were kneaded at 30 rpm for 10 minutes by using Laboplast mill [product name, Toyo Seiki Seisakusho Co., Ltd.], and a kneaded product of the magnetic powder 1, the magnetic powder 5, and TPO was obtained. 40 g of the obtained kneaded product was molded under the conditions of a molding pressure: 20 MPa, a press temperature: 200° C., and a press time: 10 minutes using a heating press device to produce a radio wave absorption sheet of Comparative Example 1 (thickness: 3 mm).

1. Peak Frequency of Transmission Attenuation Amount

The peak frequency of the transmission attenuation amount of the radio wave absorption sheet of Examples 1 to 6 and Comparative Example 1 produced above was obtained.

Specifically, as a measurement device, a transmission attenuation amount was measured at an incidence angle of 0° and in a range of 65 GHz to 90 GHz by a free space method using a vector network analyzer (product name: MS4647B) of Anritsu Corporation and a horn antenna (product name: RH19R) of Keycom Co., Ltd., and a peak frequency was obtained.

2. Radio Wave Absorption Performance

The transmission attenuation amount (unit: dB) of the radio wave absorption sheet of Examples 1 to 6 and Comparative Example 1 produced above was measured.

Specifically, as a measurement device, a transmission attenuation amount was measured at an incidence angle of 0° and in a range of 65 GHz to 90 GHz by a free space method using a vector network analyzer (product name: MS4647B) of Anritsu Corporation and a horn antenna (product name: RH19R) of Keycom Co., Ltd.

In a case where the transmission attenuation amount is 10 dB or more, it is determined that the radio wave absorption performance is excellent.

Table 2 shows "$x_{max}-x_{min}$" of the magnetic powder, the kind of the magnetic powder, the shape of absorption peak, the peak frequency of transmission attenuation amount, the transmission attenuation amount at a frequency of 76.5 GHz, the maximum value of the transmission attenuation amount, and the frequency band with the transmission attenuation amount of 10 dB or more of each radio wave absorption sheet of Examples 1 to 6 and Comparative Example 1.

FIGS. 1A to 1G respectively show a graph showing a relationship between the frequency band and the transmission attenuation amount of the radio wave absorption sheet of Examples 1 to 6 and Comparative Example 1.

TABLE 2

| | | Comparative Example 1 | Example 1 | Example 2 | Example 3 | Example 4 | Example 5 | Example 6 |
|---|---|---|---|---|---|---|---|---|
| $X_{max}-X_{min}$ | | 0.25 | 0.09 | 0.19 | 0.09 | 0.03 | 0.17 | 0.03 |
| Kind of magnetic powder | | 1 + 5 | 3 + 4 + 5 | 2 + 5 | 3 + 5 | 3 + 4 | 6 + 7 | 3 + 4 |
| Peak frequency of transmission attenuation amount [GHz] | | 72/82 | 77.8 | 77.5 | 78.4 | 77.4 | 80.5 | 77.4 |
| Radio wave absorption performance | Transmission attenuation amount at 76.5 GHz [dB] | <10 dB | ≥10 dB | ≥10 dB | ≥10 dB | ≥10 dB | ≥10 dB | ≥10 dB |
| | Maximum value of transmission attenuation amount [dB] | 14.9 | 19.2 | 13.1 | 15.7 | 21.0 | 12.4 | 15.8 |
| | Frequency band having transmission attenuation amount of 10dB or more [GHz] | 70.4~74.5 78.4~80.7 | 74.7~81.8 | 74.3~80.7 | 74.9~82.6 | 74.3~80.6 | 77.7~83.3 | 75.3~79.5 |

As shown in Table 2 and FIGS. 1A to 1F, it was confirmed that the radio wave absorption sheets of Examples 1 to 6 all exhibited excellent radio wave absorption performance in a continuous wide frequency band.

On the other hand, as shown in Table 2 and FIG. 1G, it was confirmed that the radio wave absorption sheet of Comparative Example 1 has two frequency bands with a transmission attenuation amount of 10 dB or more, and has excellent radio wave absorption performance in a continuous wide frequency band.

The contents of JP2018-159193 filed on Aug. 28, 2018 and JP2019-098736 filed on May 27, 2019 are incorporated herein by reference.

All of the documents, the patent applications, and the technology standards described here are incorporated here by reference.

What is claimed is:

1. A powder mixture of a magnetoplumbite-type hexagonal ferrite,
   wherein the powder mixture is a mixture of powders of two or more kinds of compounds represented by Formula (1),
   wherein each of the powders of the two or more kinds of compounds represented by Formula (1) is a single crystal powder, wherein the two or more kinds of compounds represented by Formula (1) are two or more kinds of compounds having different values of x in Formula (1), and wherein in the two or more kinds of compounds having different values of x in Formula (1), in a case where a maximum value of x is defined as $X_{max}$ and a minimum value of x is defined as $X_{min}$, a relationship of $X_{max}-X_{min} \leq 0.2$ is satisfied, $$AFe_{(12-x)}Al_xO_{19} \qquad \text{Formula (1)}$$

wherein in Formula (1), A represents at least one metal element selected from the group consisting of Sr, Ba, Ca, and Pb, and x satisfies $1.5 \leq x \leq 8.0$.

2. The powder mixture of a magnetoplumbite-type hexagonal ferrite according to claim 1,
wherein a relationship of $X_{max}-X_{min} \leq 0.15$ is satisfied.

3. The powder mixture of a magnetoplumbite-type hexagonal ferrite according to claim 1,
wherein the powder of the magnetoplumbite-type hexagonal ferrite is used for a radio wave absorber.

4. The powder mixture of a magnetoplumbite-type hexagonal ferrite according to claim 1,
wherein a relationship of $0.03 \leq X_{max}-X_{min} \leq 0.2$ is satisfied.

5. The powder mixture of a magnetoplumbite-type hexagonal ferrite according to claim 1,
wherein A in Formula (1) is at least one metal element selected from the group consisting of Sr, Ba, and Ca.

6. The powder mixture of a magnetoplumbite-type hexagonal ferrite according to claim 1,
wherein A in Formula (1) includes Sr.

7. A method for producing the powder mixture of a magnetoplumbite-type hexagonal ferrite according to claim 1, the method comprising:
a step of preparing powders of two or more kinds of compounds having different values of x in Formula (1); and
a step of mixing the prepared powders of two or more kinds of compounds having different values of x in Formula (1) so that a relationship of $X_{max}-X_{min} \leq 0.2$ is satisfied, in a case where a maximum value of x is defined as $X_{max}$ and a minimum value of x is defined as $X_{min}$, in two or more kinds of compounds having different values of x in Formula (1).

8. A radio wave absorber comprising:
the powder mixture of a magnetoplumbite-type hexagonal ferrite according to claim 1; and
a binder.

* * * * *